(12) United States Patent
Fuse

(10) Patent No.: US 10,128,135 B2
(45) Date of Patent: Nov. 13, 2018

(54) HEAT TREATMENT METHOD AND HEAT TREATMENT DEVICE

(71) Applicant: SCREEN Holdings Co., Ltd., Kyoto (JP)

(72) Inventor: Kazuhiko Fuse, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 15/560,047

(22) PCT Filed: Nov. 18, 2015

(86) PCT No.: PCT/JP2015/082343
§ 371 (c)(1),
(2) Date: Sep. 20, 2017

(87) PCT Pub. No.: WO2016/151937
PCT Pub. Date: Sep. 29, 2016

(65) Prior Publication Data
US 2018/0076061 A1 Mar. 15, 2018

(30) Foreign Application Priority Data
Mar. 26, 2015 (JP) ................................ 2015-064191

(51) Int. Cl.
*H01L 21/67* (2006.01)
*H01L 21/22* (2006.01)
(Continued)

(52) U.S. Cl.
CPC ........ *H01L 21/67115* (2013.01); *H01L 21/22* (2013.01); *H01L 21/225* (2013.01); *H01L 21/265* (2013.01); *H01L 21/68742* (2013.01)

(58) Field of Classification Search
CPC ... H01L 21/67115; H01L 21/22; H01L 21/225
See application file for complete search history.

(56) References Cited

U.S. PATENT DOCUMENTS

2012/0085941 A1 4/2012 Shibata
2012/0244725 A1 9/2012 Fuse et al.
2015/0206751 A1 7/2015 Kato

FOREIGN PATENT DOCUMENTS

JP 2005-260262 9/2005
JP 2005-260262 A 9/2005
(Continued)

OTHER PUBLICATIONS

Taiwanese Office Action dated Jan. 25, 2017 with Japanese translation and English partial translation.
(Continued)

*Primary Examiner* — Errol Fernandes
(74) *Attorney, Agent, or Firm* — Ostrolenk Faber LLP

(57) ABSTRACT

First, a substrate with one main surface on which a thin film of at least one of a mono-molecular layer and a multi-molecular layer including dopants is formed is prepared. Subsequently, the prepared substrate is placed in a chamber, and dopants included in the thin film are introduced from the thin film into a surface layer of the substrate by providing the substrate, through irradiation with light from a first lamp, with preliminary heat treatment in a first temperature band higher than a temperature before heating. Then, the dopants introduced into the surface layer of the substrate are activated by heating the substrate provided with the preliminary heat treatment and placed in the chamber from the first temperature band to a second temperature band higher than the first temperature band through irradiation with flash light from a second lamp.

2 Claims, 8 Drawing Sheets

(51) Int. Cl.
  *H01L 21/225* (2006.01)
  *H01L 21/265* (2006.01)
  *H01L 21/687* (2006.01)

(56) References Cited

FOREIGN PATENT DOCUMENTS

| JP | 2012-082462 | 4/2012 |
| JP | 2012-199471 | 10/2012 |
| JP | 2014-022588 | 2/2014 |
| JP | 2014-045065 | 3/2014 |
| JP | 2014-045065 A | 3/2014 |
| WO | WO-2014/013809 | 1/2014 |

OTHER PUBLICATIONS

Johnny C. Ho, Roie Yerushalmi, Zachery A. Jacobson, Zhiyong Fan, Robert L. Alley and Ali Javey, "Controlled Nanoscale Doping of Semiconductors Via Molecular Monolayers, Nature Materials", Nature Publishing Group, vol. 7, pp. 62-67, Published online on Nov. 11, 2007.

International Search Report dated Feb. 16, 2016 in corresponding PCT International Application No. PCT/JP2015/082343.

Office Action issued by Taiwanese Patent Office dated Nov. 14, 2017 with Japanese translation and English translation based on the Japanese translation. Portions relevant to prior-art based rejections are translated.

Notification Concerning Transmittal of International Preliminary Report on Patentability and its English translation of the Notification of Transmittal of Translation of the International Preliminary Report on Patentability dated Sep. 26, 2017 including translation of the Written Opinion in corresponding International Application No. PCT/JP2015/082343.

Notification Concerning Transmittal of International Preliminary Report on Patentability and its English translation of the Notification of Transmittal of Translation of the International Preliminary Report on Patentability dated Oct. 5, 2017 including translation of the Written Opinion in corresponding International Application No. PCT/JP2015/082343.

F I G. 2
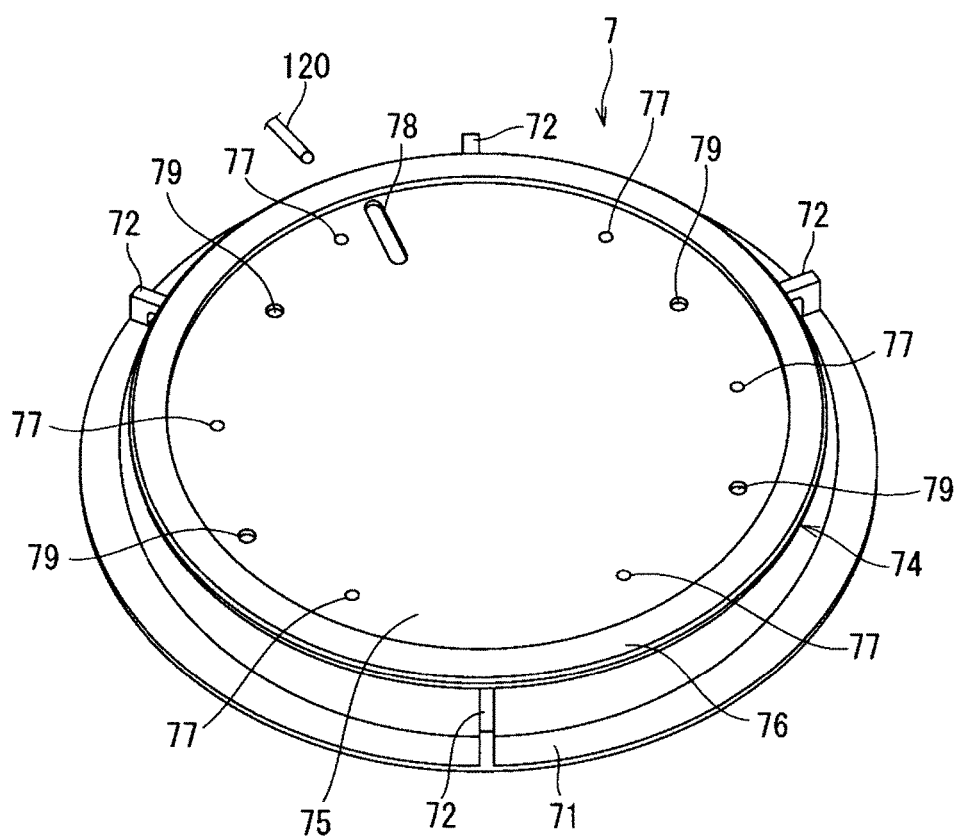

HEAT TREATMENT METHOD AND HEAT TREATMENT DEVICE

CROSS-REFERENCE TO RELATED APPLICATIONS

The present application is a 35 U.S.C. §§ 371 national phase conversion of PCT/JP2015/082343, filed Nov. 18, 2015, which claims priority to Japanese Patent Application No. 2015-064191, filed Mar. 26, 2015, the contents of which are incorporated herein by reference. The PCT International Application was published in the Japanese language.

TECHNICAL FIELD

The present invention relates to a heat treatment method and a heat treatment device that provide heat treatment to a thin-plate fine electronic substrate (hereinafter simply referred to as a "substrate") such as a semiconductor wafer having a circular disk shape through light irradiation.

BACKGROUND ART

In a process of manufacturing a semiconductor device, impurity (dopant) introduction is an essential process for forming a pn junction in a semiconductor wafer. The current impurity introduction is typically achieved by an ion injection technique and an annealing technique thereafter. The ion injection technique is a technology of ionizing impurities of elements such as boron (B), arsenic (As), and phosphorus (P) and physically injecting the ionized impurities into a silicon substrate through collision at high acceleration voltage (refer to Patent Document 1, for example). The injected impurities are activated through anneal treatment.

The ion injection technique, which has been conventionally and widely performed at impurity introduction, provides easiness of controlling of the injection depth and concentration of impurities. However, recent further refinement of semiconductor devices requires impurity introduction only into an extremely shallow region (at a depth of several nm or less) of the surface layer of a substrate. It is difficult with the ion injection technique to accurately inject impurities only into such an extremely shallow surface layer region. This is because the impurity injection by the ion injection technique generates crystal defects, which may increase variation in depths at which the impurities are injected into the surface layer of a semiconductor wafer, and may cause abnormal diffusion of the impurities at annealing.

In a developing technology (extremely shallow junction forming technology), a mono-molecular layer including impurities (dopants) is formed on the surface of a silicon substrate through wet treatment, and the impurities are diffused into the outermost surface layer of the substrate through heat treatment thereafter to introduce the impurities only into an extremely shallow region of the surface layer of the substrate (refer to Non Patent Document 1). Examples of such an extremely shallow junction forming technology include a technology utilizing mono layer doping (MLD). In this technology, impurities diffuse from a mono-molecular layer to a substrate, and thus are introduced only into an extremely shallow region of the surface layer of the substrate. When a mono-molecular layer including impurities is formed on a complicated irregular surface of a substrate through wet treatment, the impurities can be uniformly introduced into the entire surface.

PRIOR ART DOCUMENTS

Patent Document

Patent Document 1: Japanese Patent Application Laid-Open No. 2012-82462 Non Patent Document Non Patent Document 1: JOHNNY C. HO, ROIE YERUSHALMI, ZACHERY A. JACOBSON, ZHIYONG FAN, ROBERT L. ALLEY and ALI JAVEY, Controlled nanoscale doping of semiconductors via molecular monolayers, nature materials, Nature Publishing Group, Vol. 7, pp. 62-67, Published online on Nov. 11, 2007

SUMMARY OF INVENTION

Problems to be Solved by the Invention

In the technology utilizing MLD disclosed in Non Patent Document 1, after a mono-molecular layer is formed on one main surface of a substrate, a process of diffusing impurities into the surface layer of the substrate by rapid thermal anneal (RTA) and a process of activating the impurities by flush lamp anneal (FLA) are performed temporally sequentially. However, such treatment requires two or more heat treatment devices including a heat treatment device configured to perform RTA and a heat treatment device configured to perform FLA, which leads to increase in a cost of preparing the heat treatment devices, a space needed for installation thereof, and a time taken for treatment.

The present invention is intended to solve the above-described problem by providing a heat treatment method and a heat treatment device that facilitate device installation and achieve reduction of a heat treatment time.

Means for Solving the Problems

To solve the above-described problem, a heat treatment method according to a first aspect includes: step (a) of preparing a substrate with one main surface on which a thin film of at least one of a mono-molecular layer and a multi-molecular layer including dopants is formed; step (b) of placing the substrate prepared in the step (a) in a chamber; step (c) of introducing the dopants included in the thin film from the thin film into a surface layer of the substrate by providing the substrate placed in the chamber in the step (b), through irradiation with light from a first lamp, with preliminary heat treatment in a first temperature band higher than a temperature before heating; and step (d) of activating the dopants introduced into the surface layer of the substrate in the step (c) by heating the substrate provided with the preliminary heat treatment in the step (c) and placed in the chamber from the first temperature band to a second temperature band higher than the first temperature band through irradiation with flash light from a second lamp.

A heat treatment method according to a second aspect is the heat treatment method according to the first aspect in which: in the step (c), the substrate placed in the chamber is provided with first heat treatment in a high temperature band that is higher temperature in the first temperature band through irradiation with light from the first lamp, and then with second heat treatment in a low temperature band that is lower than the high temperature band in the first temperature band; and in the step (d), the substrate provided with the second heat treatment in the step (c) and placed in the chamber is heated from the low temperature band to the second temperature band through irradiation with the flash light from the second lamp.

A heat treatment device according to a third aspect is a heat treatment device configured to heat a substrate through irradiation with light, including: a chamber; a holding unit disposed in the chamber and configured to hold the substrate; a first irradiator configured to provide the substrate held by the holding unit, through irradiation with light from a first lamp, with preliminary heat treatment in a first temperature band higher than a temperature before heating; a second irradiator configured to heat the substrate provided with the preliminary heat treatment in the first temperature band by the first irradiator and held by the holding unit from the first temperature band to a second temperature band higher than the first temperature band through irradiation with flash light from a second lamp; and a control unit configured to control the first irradiator and the second irradiator so that the first irradiator provides the substrate with first heat treatment in a high temperature band that is higher temperature in the first temperature band through irradiation with light from the first lamp, and then with second heat treatment in a low temperature band that is lower than the high temperature band in the first temperature band, and the second irradiator heats the substrate provided with the second heat treatment by the first irradiator and held by the holding unit from the low temperature band to the second temperature band through irradiation with the flash light from the second lamp.

Effects of the Invention

In the heat treatment method according to the first aspect, the substrate with one main surface on which a thin film of at least one of a mono-molecular layer and a multi-molecular layer including dopants is formed is placed in the chamber, preliminarily heated to the first temperature band through irradiation with light from the first lamp, and heated from the first temperature band to the second temperature band higher than the first temperature band through irradiation with flash light from the second lamp. Accordingly, the impurities can be introduced only into an extremely shallow region of the surface layer of the substrate and activated. Then, for example, since the heat treatment is continuously performed in the same chamber in the first temperature band and the second temperature band, device installation is facilitated and a heat treatment time can be reduced.

In the heat treatment method according to the second aspect, the substrate placed in the chamber is provided with the first heat treatment in the high temperature band that is higher temperature in the first temperature band through irradiation with light from the first lamp, and then with the second heat treatment in the low temperature band that is lower temperature in the first temperature band. Then, the substrate provided with the second heat treatment and placed in the chamber is heated from the low temperature band to the second temperature band through irradiation with flash light from the second lamp. Accordingly, the substrate is prevented from being excessively heated through irradiation with flash light, and thus abnormal diffusion of impurities is unlikely to occur at heating through irradiation with flash light. As a result, the impurities can be appropriately introduced only into an extremely shallow region of the surface layer of the substrate.

In the heat treatment device according to the third aspect, the substrate placed in the chamber is provided with the first heat treatment in the high temperature band that is higher temperature in the first temperature band through irradiation with light from the first lamp, and then with the second heat treatment in the low temperature band that is lower temperature in the first temperature band. Then, the substrate provided with the second heat treatment and held by the holding unit is heated from the low temperature band to the second temperature band through irradiation with flash light from the second lamp. Accordingly, the substrate is prevented from being excessively heated, and thus abnormal diffusion of impurities is unlikely to occur at heating through irradiation with flash light. As a result, the impurities can be introduced only into an extremely shallow region of the surface layer of the substrate and activated. In addition, for example, since the heat treatment is continuously performed in the same chamber in the first temperature band and the second temperature band, device installation is facilitated and a heat treatment time can be reduced.

BRIEF DESCRIPTION OF DRAWINGS

FIG. 2 is a perspective view illustrating the entire appearance of a holding unit.

DESCRIPTION OF EMBODIMENT

Figure 1:
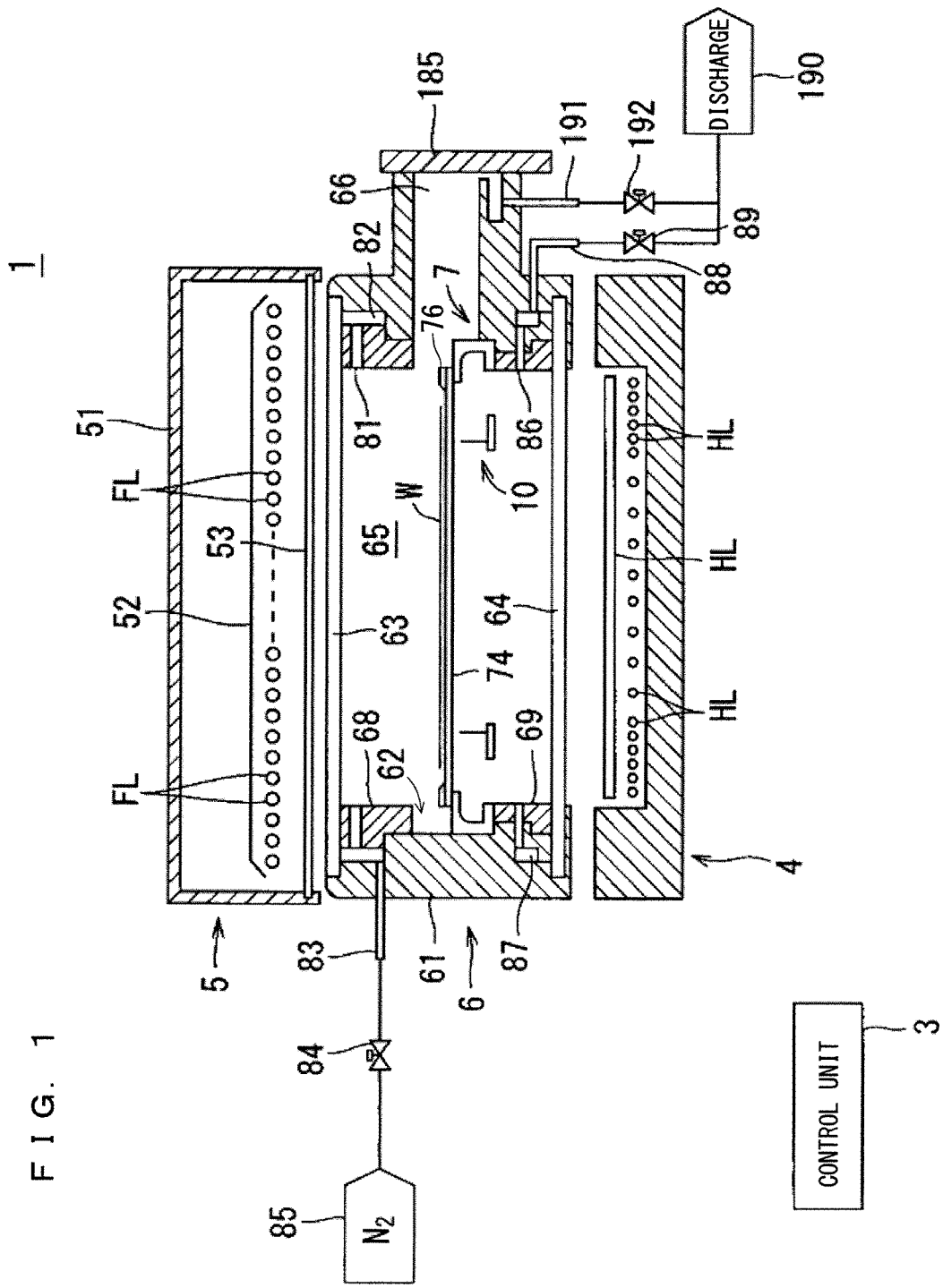
FIG. 1 is a longitudinal sectional view illustrating a configuration of a heat treatment device according to one embodiment.

The following describes one embodiment and various modifications with reference to the accompanying drawings. In the drawings, any parts having identical configuration and function are denoted by an identical reference sign, and any duplicate description thereof will be omitted below. In FIG. 1 and the following drawings, the dimension of each component and the number thereof are exaggerated or simplified as necessary to facilitate understanding.

FIG. 1 is a longitudinal sectional view illustrating a configuration of a heat treatment device 1 according to the one embodiment. The heat treatment device 1 is configured to heat a semiconductor wafer W as a substrate by irradiating the semiconductor wafer W with light. Specifically, the heat treatment device 1 is a device (also referred to as a flash lamp annealing device) configured to heat the semiconductor wafer W by irradiating the semiconductor wafer W with flash light. The semiconductor wafer W as a treatment target typically has a circular disk shape. The size of the semiconductor wafer W is not particularly limited, but may be, for example, φ300 mm or φ450 mm. A mono-molecular layer of desired impurities (dopants) is accumulated on a main surface of the semiconductor wafer W conveyed into the heat treatment device 1. The accumulated impurities are introduced into the outermost surface layer of the semiconductor wafer W and activated through heating treatment by the heat treatment device 1.

The heat treatment device 1 includes a chamber 6 that houses the semiconductor wafer W, a halogen heating unit 4 as a first irradiator including a plurality of built-in halogen lamps HL, and a flash heating unit 5 as a second irradiator including a plurality of built-in flash lamps FL. Specifically, the flash heating unit 5 is provided above the chamber 6, and the halogen heating unit 4 is provided below the chamber 6. The heat treatment device 1 includes, inside the chamber 6, a holding unit 7 and a transfer mechanism 10. The holding unit 7 is configured to hold the semiconductor wafer W in, for example, a horizontal posture. The transfer mechanism 10 is configured to transfer the semiconductor wafer W between the holding unit 7 and the outside of the device. The heat treatment device 1 further includes a control unit 3 configured to execute heat treatment of the semiconductor wafer W by controlling operation mechanisms provided to the halogen heating unit 4, the flash heating unit 5, and the chamber 6.

The chamber 6 includes quartz chamber windows mounted at parts above and below a tubular chamber side part 61. The chamber side part 61 includes a schematically tubular shape with upper and lower openings, the upper opening of the chamber side part 61 being blocked by mounting an upper chamber window 63, and the lower opening of the chamber side part 61 being blocked by mounting a lower chamber window 64. The upper chamber window 63 serving as a ceiling part of the chamber 6 is a quartz member having a circular disk shape and functions as a quartz window that transmits flash light emitted by the flash heating unit 5 into the chamber 6. The lower chamber window 64 serving as a floor part of the chamber 6 is a quartz member having a circular disk shape and functions as a quartz window that transmits light from the halogen heating unit 4 into the chamber 6.

A reflection ring 68 is mounted at an upper part of an inner wall surface of the chamber side part 61, and a reflection ring 69 is mounted at a lower part of the inner wall surface of the chamber side part 61. The reflection rings 68 and 69 have circular ring shapes. The upper reflection ring 68 is mounted on the chamber side part 61 by fitting from above. The lower reflection ring 69 is mounted on the chamber side part 61 by fitting from below and fastening with a screw (not illustrated). In other words, the reflection rings 68 and 69 are detachably mounted on the chamber side part 61. A heat treatment space 65 is defined to be an inner space of the chamber 6, in other words, a space surrounded by the upper chamber window 63, the lower chamber window 64, the chamber side part 61, and the reflection rings 68 and 69.

When the reflection rings 68 and 69 are mounted on the chamber side part 61, a recess 62 is formed in the inner wall surface of the chamber 6. Specifically, the recess 62 is enclosed by a central part of the inner wall surface of the chamber side part 61, on which the reflection rings 68 and 69 are not mounted, a lower end surface of the reflection ring 68, and an upper end surface of the reflection ring 69. The recess 62 is formed in a circular ring shape in a horizontal direction on the inner wall surface of the chamber 6, and surrounds the holding unit 7 that holds the semiconductor wafer W.

The chamber side part 61 and the reflection rings 68 and 69 are formed of a metallic material (stainless steel, for example) having excellent strength and thermal resistance. The reflection rings 68 and 69 have inner peripheral surfaces mirrored by electrolytic nickel plating.

The chamber side part 61 is provided with a conveyance opening (furnace entrance) 66 through which the semiconductor wafer W is conveyed into and out of the chamber 6. The conveyance opening 66 can be opened and closed through a gate valve 185. The conveyance opening 66 is communicated and connected with an outer peripheral surface of the recess 62. With this configuration, when the conveyance opening 66 is opened through the gate valve 185, the semiconductor wafer W can be conveyed into the heat treatment space 65 through the conveyance opening 66 and the recess 62 and can be conveyed out of the heat treatment space 65 through the recess 62. When the conveyance opening 66 is closed through the gate valve 185, the heat treatment space 65 inside the chamber 6 is sealed.

A gas supply hole 81 through which treatment gas (in the present embodiment, nitrogen gas ($N_2$)) is supplied to the heat treatment space 65 is provided at an inner wall upper part of the chamber 6. The gas supply hole 81 is provided at a position higher than the recess 62, or may be provided to the reflection ring 68. The gas supply hole 81 is communicated and connected with a gas supply tube 83 through a buffer space 82 formed in a circular ring shape inside a sidewall of the chamber 6. The gas supply tube 83 is connected with a gas supply source 85. A valve 84 is interposed halfway through the gas supply tube 83. When the valve 84 is opened, nitrogen gas is supplied from the gas supply source 85 to the buffer space 82. Having flowed into the buffer space 82, the nitrogen gas spreads inside the buffer space 82 having a fluid resistance smaller than that of the gas supply hole 81 and is supplied into the heat treatment space 65 through the gas supply hole 81. The treatment gas is not limited to nitrogen gas, but may be inert gas such as argon (Ar) or helium (He), or reactive gas such as oxygen ($O_2$), hydrogen ($H_2$), chlorine ($Cl_2$), hydrogen chloride (HCl), ozone ($O_3$), or ammonia ($NH_3$).

A gas discharge hole 86 through which gas inside the heat treatment space 65 is discharge is provided at an inner wall lower part of the chamber 6. The gas discharge hole 86 is provided at a position lower than the recess 62, or may be provided to the reflection ring 69. The gas discharge hole 86 is communicated and connected with a gas discharge pipe 88 through a buffer space 87 formed in a circular ring shape inside the sidewall of the chamber 6. The gas discharge pipe 88 is connected with a discharge unit 190. A valve 89 is interposed halfway through the gas discharge pipe 88. When the valve 89 is opened, gas in the heat treatment space 65 is discharged to the gas discharge pipe 88 through the gas discharge hole 86 and the buffer space 87. A plurality of the gas supply holes 81 and a plurality of the gas discharge holes 86 may be provided along a circumferential direction of the chamber 6, and may have slit shapes. The gas supply source 85 and the discharge unit 190 may be mechanisms provided to the heat treatment device 1, or may be a utility of a factory at which the heat treatment device 1 is installed.

A gas discharge pipe 191 through which gas inside the heat treatment space 65 is discharged is connected with a leading end of the conveyance opening 66. The gas discharge pipe 191 is connected with the discharge unit 190 through a valve 192. When the valve 192 is opened, gas inside the chamber 6 is discharged through the conveyance opening 66.

Figure 3:
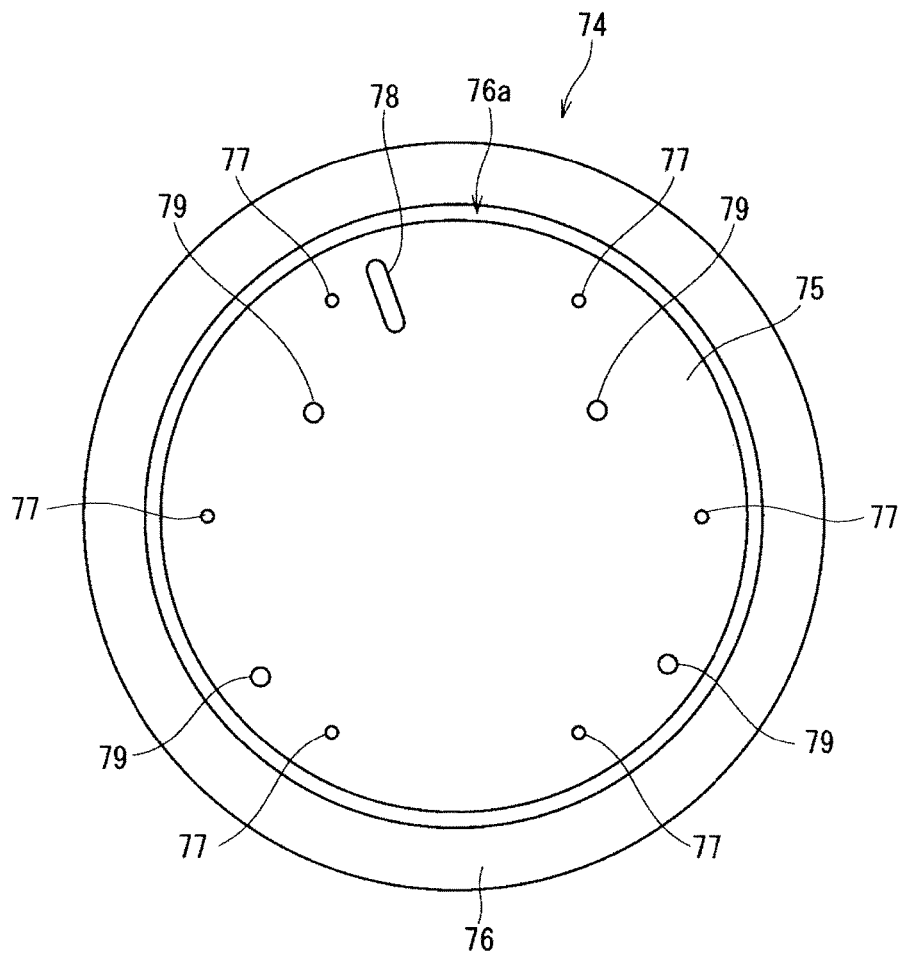
FIG. 3 is a plan view of a susceptor of the holding unit when viewed from top.
Figure 4:
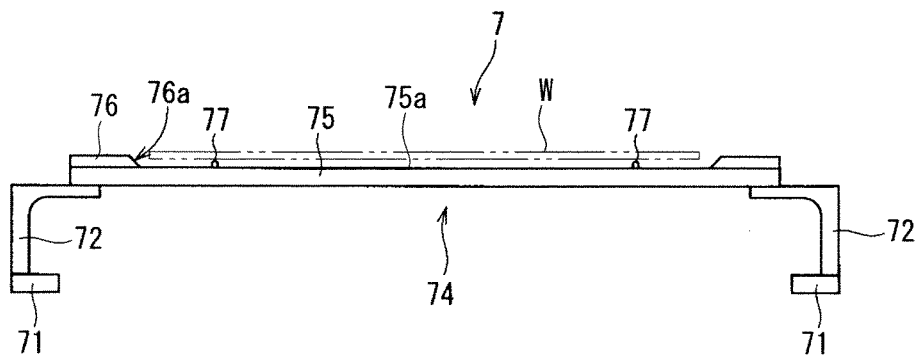
FIG. 4 is a cross-sectional view schematically illustrating a section of the holding unit.

FIG. 2 is a perspective view illustrating the entire appearance of the holding unit 7. FIG. 3 is a plan view of a susceptor 74 of the holding unit 7 when viewed from top, and FIG. 4 is a cross-sectional view schematically illustrating a section of the holding unit 7 along a plane vertical to a horizontal plane. In FIG. 4, an outer edge of the semiconductor wafer W being held by the holding unit 7 is drawn with dashed and double-dotted line. The holding unit 7 includes a base ring 71, a coupling unit 72, and the susceptor 74. The base ring 71, the coupling unit 72, and the susceptor 74 are made of quartz. In other words, the holding unit 7 is entirely made of quartz.

The base ring 71 is a quartz member having a circular ring shape. When placed on a bottom surface of the recess 62, the base ring 71 is supported by a wall surface of the chamber 6 (refer to FIG. 1). A plurality (in the present embodiment, four) of the coupling units 72 are erected on an upper surface of the base ring 71 having a circular ring shape along a circumferential direction thereof. The coupling units 72 are quartz members firmly fixed to the base ring 71 by welding. The base ring 71 may have, for example, an arc shape that is a circular ring shape having a lacked part.

The susceptor 74 holds the semiconductor wafer W placed on the susceptor 74 in the chamber 6. The susceptor 74 is supported by the four coupling units 72 provided to the base ring 71. The susceptor 74 includes a holding plate 75 as a plate, a guide ring 76 as a guide, and a plurality of support pins 77. The holding plate 75 is a circular flat plate member made of quartz. The diameter of the holding plate 75 is larger than the diameter of the semiconductor wafer W. In other words, the holding plate 75 has a plane size larger than that of the semiconductor wafer W.

The guide ring 76 is installed at a peripheral part of an upper surface of the holding plate 75. The guide ring 76 is a circular ring member having an inner diameter larger than the diameter of the semiconductor wafer W. The guide ring 76 is made of quartz like the holding plate 75. The guide ring 76 may be welded to the upper surface of the holding plate 75, or may be fixed to the holding plate 75 by, for example, a pin separately formed through fabrication. Alternatively, the guide ring 76 may be simply placed on the peripheral part of the upper surface of the holding plate 75. When the guide ring 76 is welded to the holding plate 75, generation of particles due to sliding of quartz members can be suppressed. When the guide ring 76 is placed on the peripheral part, distortion of the holding plate 75 due to welding can be prevented.

Figure 5:
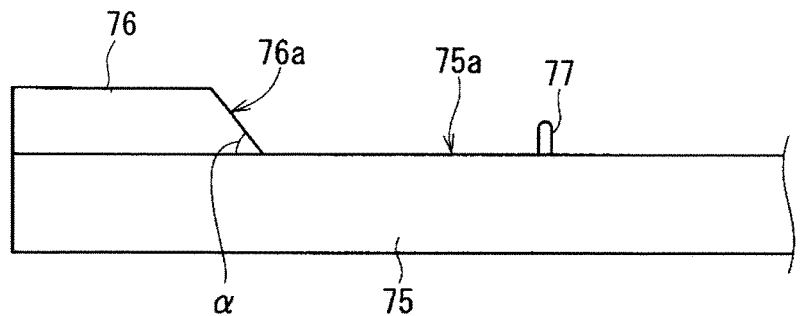
FIG. 5 is an enlarged view of an installation part of a guide ring.

FIG. 5 is an enlarged view of an installation part of the guide ring 76. The guide ring 76 has, as an inner periphery, a tapering surface 76a expanding upward from the holding plate 75. A region of the upper surface of the holding plate 75, which is inside a leading end (lower end) of the tapering surface 76a, is a placement surface 75a on which the semiconductor wafer W is placed. The gradient α of the tapering surface 76a of the guide ring 76 with respect to the placement surface 75a of the holding plate 75 is equal to or larger than 30° and equal to or smaller than 70° (in the present embodiment, 45°). The tapering surface 76a has a surface average roughness (Ra) of 1.6 μm or smaller.

The inner diameter of the guide ring 76 (diameter of the leading end of the tapering surface 76a) is larger than the diameter of the semiconductor wafer W by an amount equal to or larger than 10 mm and equal to or smaller than 40 mm. Thus, when the semiconductor wafer W is held at a central part of the placement surface 75a of the holding plate 75, the distance between an outer peripheral end of the semiconductor wafer W and the leading end of the tapering surface 76a is equal to or larger than 5 mm and equal to or smaller than 20 mm. In the present embodiment, the inner diameter of the guide ring 76 is φ320 mm for the semiconductor wafer W of φ300 mm (the distance between the outer peripheral end of the semiconductor wafer W and the leading end of the tapering surface 76a is 10 mm). The outer diameter of the guide ring 76 is not particularly limited, but may be equal to, for example, the diameter of the holding plate 75 (in the present embodiment, φ340 mm).

The plurality of support pins 77 are erected on the placement surface 75a of the holding plate 75. In the present embodiment, the six support pins 77 are erected at angles separated from each other by 60° on the circumference of a circle concentric with an outer peripheral circle of the placement surface 75a (inner peripheral circle of the guide ring 76). The diameter of the circle on which the six support pins 77 are disposed (distance between the facing support pins 77 in a pair) is smaller than the diameter of the semiconductor wafer W, and is φ280 mm in the present embodiment. Each support pin 77 is made of quartz. The plurality of support pins 77 may be erected by fitting at recesses drilled in the upper surface of the holding plate 75.

The four coupling units 72 erected on the base ring 71 are firmly fixed to a lower-surface peripheral part of the holding plate 75 of the susceptor 74 by welding. In other words, the susceptor 74 and the base ring 71 are fixedly coupled with each other through the coupling units 72. The base ring 71 of the holding unit 7 thus configured is supported by the wall surface of the chamber 6 when the holding unit 7 is mounted on the chamber 6. When the holding unit 7 is mounted on the chamber 6, the holding plate 75 of the susceptor 74 is in a horizontal posture (posture in which the normal thereof is aligned with the vertical direction). When conveyed into the chamber 6, the semiconductor wafer W is placed on the susceptor 74 of the holding unit 7 mounted on the chamber 6 and is held in a horizontal posture. When held by the susceptor 74 in this state, the semiconductor wafer W is supported through point contact by the plurality of support pins 77 erected on the holding plate 75. In other words, the semiconductor wafer W is supported at a predetermined interval from the placement surface 75a of the holding plate 75 by the plurality of support pins 77. The thickness of the guide ring 76 is larger than the height of the support pins 77. With this configuration, the guide ring 76 prevents positional shift of the semiconductor wafer W supported by the support pins 77 in the horizontal direction.

As illustrated in FIGS. 2 and 3, an vertically penetrating opening 78 is formed in the holding plate 75 of the susceptor 74. The opening 78 is provided to allow a radiation thermometer 120 to receive radiation light (infrared light) emitted from a lower surface of the semiconductor wafer W held by the susceptor 74. Specifically, light emitted from a back surface of the semiconductor wafer W held by the susceptor 74 is received by the radiation thermometer 120 through the opening 78, and the temperature of the semiconductor wafer W is measured by a separately provided detector. In addition, four through-holes 79 through which lift pins 12 of the transfer mechanism 10 to be described later penetrate to transfer the semiconductor wafer W are drilled through the holding plate 75 of the susceptor 74.

Figure 6:
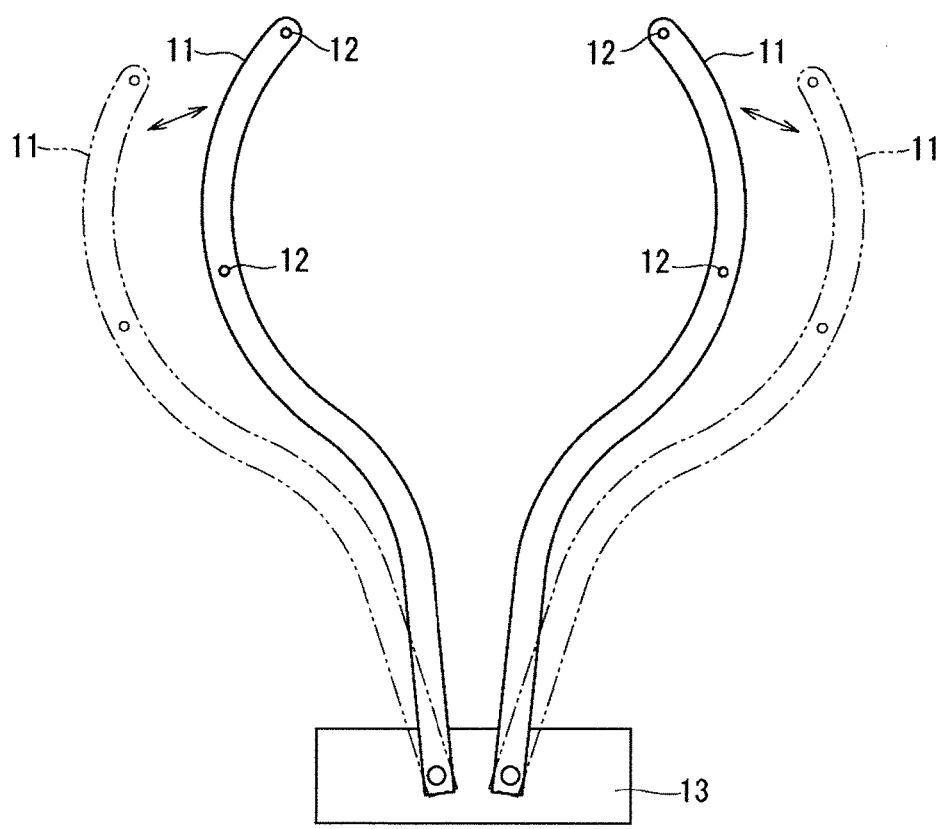
FIG. 6 is a plan view of a transfer mechanism.
Figure 7:
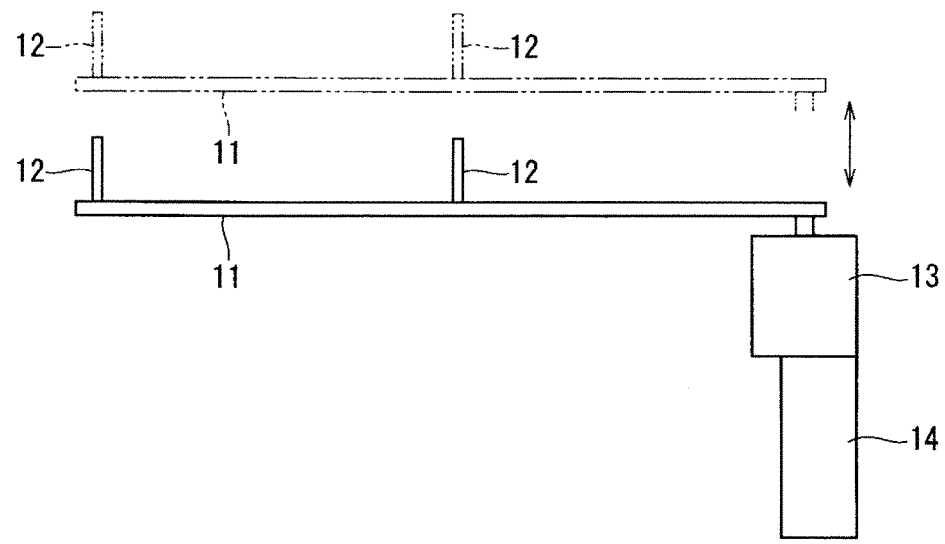
FIG. 7 is a side view of the transfer mechanism.

FIG. 6 is a plan view of the transfer mechanism 10. FIG. 7 is a side view of the transfer mechanism 10. The transfer mechanism 10 includes two transfer arms 11. The transfer arm 11 has an arc shape along the recess 62 in a substantially circular ring shape. Two of the lift pins 12 are erected on each transfer arm 11. The transfer arms 11 can be each rotated by a horizontal movement mechanism 13. The horizontal movement mechanism 13 horizontally moves the pair of transfer arms 11 between a transfer operation position (position drawn with a solid line in FIG. 6) at which the transfer arms 11 transfer the semiconductor wafer W to the holding unit 7, and a retracted position (position drawn with a dashed and double-dotted line in FIG. 6) at which the transfer arms 11 do not overlap with the semiconductor wafer W held by the holding unit 7 in plan view. The horizontal movement mechanism 13 may rotate the transfer arms 11 by using individual motors, or may rotate the pair of transfer arms 11 in a coupled manner by using a single motor through a link mechanism.

The pair of transfer arms 11 are elevated up and down together with the horizontal movement mechanism 13 by an elevation mechanism 14. When the elevation mechanism 14 elevates up the pair of transfer arms 11 at the transfer operation position, the four lift pins 12 pass through the through-holes 79 (refer to FIGS. 2 and 3) drilled through the holding plate 75 of the susceptor 74, and upper ends of the lift pins 12 protrude out of the upper surface of the holding plate 75. When the elevation mechanism 14 elevates down the pair of transfer arms 11 at the transfer operation position to remove the lift pins 12 from the through-holes 79 and the horizontal movement mechanism 13 opens the pair of transfer arms 11, the transfer arms 11 are moved to the retracted position. The retracted position of the pair of transfer arms 11 is located directly above the base ring 71 of the holding unit 7. Since the base ring 71 is placed on the bottom surface of the recess 62, the retracted position of the transfer arms 11 is located inside the recess 62. A discharge mechanism (not illustrated) is provided near sites at which drive units (the horizontal movement mechanism 13 and the elevation mechanism 14) of the transfer mechanism 10 are provided, and is configured to discharge atmosphere around the drive units of the transfer mechanism 10 to the outside of the chamber 6.

As illustrated in FIG. 1, the flash heating unit 5 is provided above the chamber 6 and includes, inside a housing 51, a light source including a plurality (in the present embodiment, thirty) of flash lamps FL as second lamps, and a reflector 52 provided to cover over the light source. The flash heating unit 5 heats the semiconductor wafer W held by the susceptor 74 through irradiating with flash light emitted by the plurality of flash lamps FL. In the present embodiment, the flash lamps FL are xenon flash lamps. A lamp light emission window 53 is mounted at a bottom part of the housing 51 of the flash heating unit 5. The lamp light emission window 53 serving as a floor part of the flash heating unit 5 is a plate window made of quartz. When the flash heating unit 5 is installed above the chamber 6, the lamp light emission window 53 faces to the upper chamber window 63. The flash lamps FL irradiate the heat treatment space 65 with flash light from above the chamber 6 through the lamp light emission window 53 and the upper chamber window 63.

The plurality of flash lamps FL are each a bar lamp having a long cylindrical shape, and are arrayed in a plane such that longitudinal directions of the flash lamps FL are parallel to each other along the main surface of the semiconductor wafer W held by the holding unit 7 (in other words, along the horizontal direction). Thus, the array of the flash lamps FL forms a horizontal plane.

The xenon flash lamps FL each include a bar glass tube (discharge tube) with inside of which xenon gas is encapsulated and at both end parts of which an anode and a cathode each connected with a capacitor are disposed, and a trigger electrode attached on an outer peripheral surface of the glass tube. Since the xenon gas is an electrical insulator, no electricity flows inside the glass tube in a normal state when electric charge is accumulated in the capacitor. However, when high voltage is applied to the trigger electrode to cause insulation breakdown, electricity stored in the capacitor instantaneously flows inside the glass tube, and light is released through excitation of xenon atoms or molecules thus caused. In such a xenon flash lamp FL, electrostatic energy stored in the capacitor in advance is converted into an extremely short light pulse of 0.1 millisecond to 100 milliseconds, and thus the xenon flash lamp FL can emit extremely strong light as compared to continuously turned-on light sources such as the halogen lamps HL.

The reflector 52 is provided above the plurality of flash lamps FL to entirely cover the flash lamps FL. The reflector 52 basically functions to reflect, toward the heat treatment space 65, flash light emitted by the plurality of flash lamps FL. The reflector 52 is formed of, for example, an aluminum alloy plate and has a surface (facing to the flash lamps FL) roughed by blast processing.

The halogen heating unit 4 is provided below the chamber 6 and includes a light source including a plurality (in the present embodiment, forty) of halogen lamps HL as first lamps. The halogen heating unit 4 irradiate the heat treatment space 65 with light emitted by the plurality of halogen lamps HL from below the chamber 6 through the lower chamber window 64. The semiconductor wafer W is heated through this irradiation of the semiconductor wafer W held by the susceptor 74 with the light emitted by the plurality of halogen lamps HL.

Figure 8:
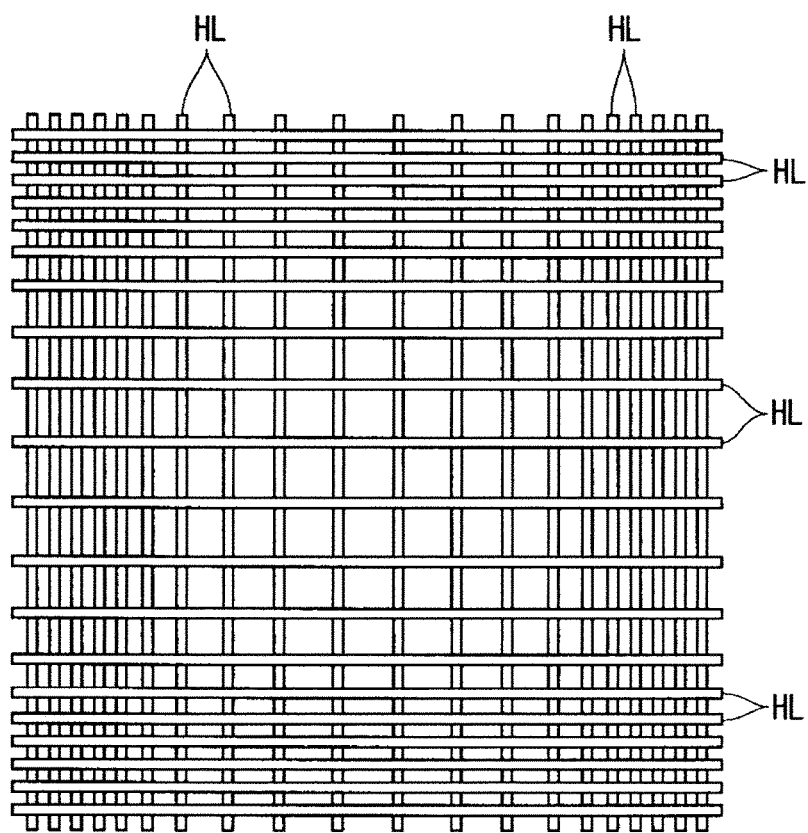
FIG. 8 is a plan view illustrating an arrangement of a plurality of halogen lamps.

FIG. 8 is a plan view illustrating an arrangement of the plurality of halogen lamps HL. In the present embodiment, the twenty halogen lamps HL are arranged in upper and lower parts respectively. The halogen lamps HL are each a bar lamp having a long cylindrical shape. In each of the upper and lower parts, the twenty halogen lamps HL are arrayed such that longitudinal directions of the halogen lamps HL are parallel to each other along the main surface of the semiconductor wafer W held by the holding unit 7 (in other words, along the horizontal direction). Thus, in each of the upper and lower parts, the array of the halogen lamps HL forms a horizontal plane.

As illustrated in FIG. 8, in each of the upper and lower parts, the halogen lamps HL are arranged more densely in a region facing to a peripheral part of the semiconductor wafer W held by the holding unit 7 than in a region facing to a central part thereof. In other words, in each of the upper and lower parts, the halogen lamps HL are arranged at shorter pitches in a peripheral part of the lamp array than in a central part thereof. With this configuration, irradiation with a larger quantity of light can be performed at the peripheral part of the semiconductor wafer W where temperature decrease is likely to occur at heating through irradiation with light from the halogen heating unit 4.

Each halogen lamp HL in the upper part and each halogen lamp HL in the lower part are arrayed to intersect with each other in a lattice shape. In other words, the forty halogen lamps HL are arranged such that the longitudinal directions of the halogen lamps HL in the upper part are orthogonal to the longitudinal directions of the halogen lamps HL in the lower part.

The halogen lamps HL are each a light source of a filament scheme in which a filament disposed inside a glass tube is heated to a white heat through energization to emit light. The glass tube encapsulates inert gas such as nitrogen or argon containing a small amount of halogen element (such as iodine or bromine). The contained halogen element suppresses a damage on the filament and allows the temperature of the filament to set to high temperature. Thus, the halogen lamps HL can continuously emit stronger light with a longer lifetime as compared to that of a normal filament lamp. In addition, the halogen lamps HL as bar lamps have long lifetimes and exhibit an excellent efficiency of light emission to the semiconductor wafer W placed above by being arranged along the horizontal direction.

The control unit 3 controls the various kinds of operation mechanisms described above provided to the heat treatment device 1. The control unit 3 has a hardware configuration similarly to that of a typical computer. Specifically, the control unit 3 includes a CPU configured to perform various kinds of arithmetic processing, a ROM as a read-only memory storing a basic program, a RAM as a readable and writable memory storing various kinds of information, and a magnetic disk storing control software and data. Processing at the heat treatment device 1 proceeds as the CPU of the control unit 3 executes a predetermined processing program.

In addition to the above-described configuration, the heat treatment device 1 includes various cooling structures to prevent excessive temperature increase of the halogen heating unit 4, the flash heating unit 5, and the chamber 6 due to thermal energy generated by the halogen lamps HL and the flash lamps FL at the heat treatment of the semiconductor wafer W. For example, a water-cooling tube (not illustrated) is provided on a wall of the chamber 6. The halogen heating unit 4 and the flash heating unit 5 each have an air cooling structure that exhausts heat by forming gas flow inside. Air is supplied to a gap between the upper chamber window 63 and the lamp light emission window 53 to cool the flash heating unit 5 and the upper chamber window 63.

Figure 9:
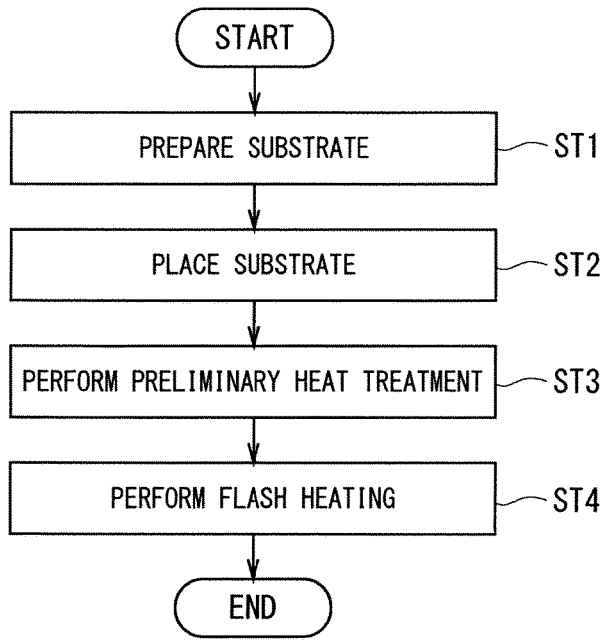
FIG. 9 is a diagram exemplarily illustrating a flowchart of thermal substrate treatment.
Figure 10:
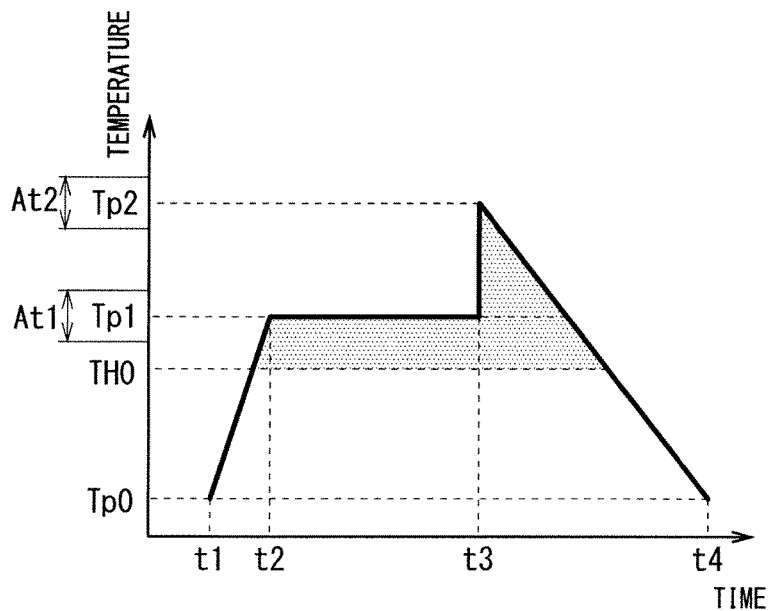
FIG. 10 is a diagram illustrating temporal change of a heat treatment temperature at a semiconductor wafer.
Figure 11:
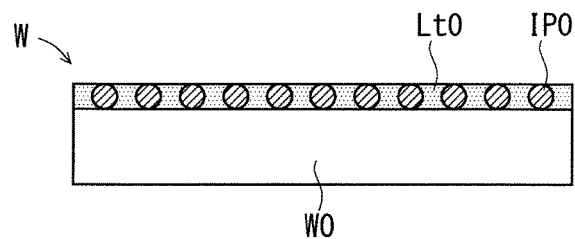
FIG. 11 is a diagram schematically illustrating a state of impurities in the semiconductor wafer at heat treatment.
Figure 12:
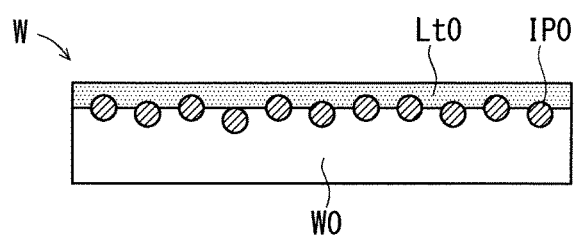
FIG. 12 is a diagram schematically illustrating a state of impurities in the semiconductor wafer at heat treatment.
Figure 13:
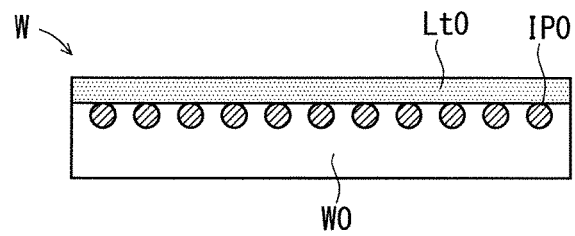
FIG. 13 is a diagram schematically illustrating a state of impurities in the semiconductor wafer at heat treatment.

The following describes the process of the heat treatment of the semiconductor wafer W by the heat treatment device 1. FIG. 9 is a diagram exemplarily illustrating a flowchart of the process of the heat treatment of the semiconductor wafer W at the heat treatment device 1. The heat treatment of the semiconductor wafer W at the heat treatment device 1 sequentially performs processing in steps ST1 to ST4 illustrated in FIG. 9. FIG. 10 is a diagram schematically illustrating an exemplary temperature change at a surface layer part of the semiconductor wafer W at the heat treatment. FIGS. 11 to 13 are each a diagram schematically illustrating states of impurities in the semiconductor wafer W at the heat treatment.

In step ST1, the semiconductor wafer W as a substrate to be provided with heat treatment is prepared. In this example, the prepared semiconductor wafer W includes, for example, a silicon substrate with one main surface on which a thin film of at least one of a mono-molecular layer and a multi-molecular layer including impurities (dopants) of, for example, boron (B), phosphorus (P), and arsenic (As) is formed. For example, the semiconductor wafer W with one main surface on which a thin film Lt0 of at least one of a mono-molecular layer and a multi-molecular layer including desired impurities (dopants) IP0 is formed, as illustrated in FIG. 11, can be prepared by a technology such as mono layer doping (MLD). In this example, the semiconductor wafer W with one main surface on which at least one of a mono-molecular layer and a multi-molecular layer including dopants is formed by, for example, wet treatment can be prepared.

Specifically, for example, a natural oxide film on the one main surface of the silicon substrate W0 is removed by hydrofluoric acid, and then chemical liquid containing the dopants IP0 are supplied onto the hydrogen-terminated one main surface of the silicon substrate W0 to replace terminating hydrogens with the dopants IP0, thereby forming a mono-molecular layer including the dopants IP0. Then, a cap film made of silicon dioxide is formed on the mono-molecular layer including the dopants IP0, and the dopants IP0 can be diffused in the outermost surface layer of the silicon substrate W0 by the heat treatment through light irradiation.

Alternatively, for example, the mono-molecular layer including the dopants IP0 may be formed without hydrogen termination. More specifically, for example, a natural oxide film on the one main surface of the silicon substrate W0 is removed through corrosion by hydrofluoric acid so that silicon is exposed on the one main surface of the silicon substrate W0. Subsequently, the hydrofluoric acid on the one main surface of the silicon substrate W0 is washed away by alcohol rinse solution. Then, chemical liquid (dopant liquid) containing the dopants IP0 is made contact with the one main surface of the silicon substrate W0 on which the silicon is exposed. Accordingly, the thin film Lt0 of a mono-molecular layer including the dopants IP0 can be formed on the one main surface in a short time.

Alternatively, the thin film Lt0 of at least one of a mono-molecular layer and a multi-molecular layer including the dopants IP0 may be formed on the one main surface of the silicon substrate W0 by, for example, applying application liquid including the dopants IP0 on the one main surface of the silicon substrate W0 rotating, and heating the silicon substrate W0. Examples of the application liquid include solution of organic solvent such as isopropyl alcohol (IPA) containing impurity elements, and compound liquid of boron oxide ($B_2O_3$) and organic binder.

The semiconductor wafer W with one main surface on which the thin film Lt0 of at least one of a mono-molecular layer and a multi-molecular layer including the dopants IP0 is formed may be prepared by, for example, forming the glass thin film (spin on grass: SOG) Lt0 to which impurities are added by doping, on the one main surface of the semiconductor wafer W by spin coating.

In step ST2, the semiconductor wafer W prepared in step ST1 is placed in the chamber 6.

In this step, first, the valve 84 for air supply is opened and the valves 89 and 192 for air discharge are opened, which starts air supply and discharge into and from the chamber 6. When the valve 84 is opened, nitrogen gas is supplied into the heat treatment space 65 through the gas supply hole 81. When the valve 89 is opened, gas inside the chamber 6 is discharged through the gas discharge hole 86. Accordingly, nitrogen gas supplied from an upper part of the heat treatment space 65 inside the chamber 6 flows downward and is discharged at a lower part of the heat treatment space 65. Simultaneously, the valve 192 is opened to discharge the gas inside the chamber 6 through the conveyance opening 66. In addition, the atmosphere around the drive units of the transfer mechanism 10 is discharged by the discharge mechanism (not illustrated). During the heat treatment of the semiconductor wafer W at the heat treatment device 1, nitrogen gas is continuously supplied into the heat treatment space 65, and the supply amount of the nitrogen gas is changed as appropriate in accordance with a treatment process.

Subsequently, the gate valve 185 is opened to leave the conveyance opening 66 opened, and the semiconductor wafer W is conveyed into the heat treatment space 65 inside the chamber 6 through the conveyance opening 66 by a conveyance robot outside the device. The semiconductor wafer W conveyed by the conveyance robot proceeds to a position directly above the holding unit 7 and stops. Then, the pair of transfer arms 11 of the transfer mechanism 10 are horizontally moved from the retracted position to the transfer operation position and elevated up so that the lift pins 12 protrude out of an upper surface of the susceptor 74 through the through-holes 79 to receive the semiconductor wafer W. In this state, the lift pins 12 are positioned higher than the upper ends of the support pins 77 of the susceptor 74.

Once the semiconductor wafer W is placed on the lift pins 12, the conveyance robot leaves the heat treatment space 65, and the conveyance opening 66 is closed through the gate valve 185. Then, the pair of transfer arms 11 are elevated down so that the semiconductor wafer W is passed from the transfer mechanism 10 to the susceptor 74 of the holding unit 7 and held in a horizontal posture from below. In this state, the semiconductor wafer W is positioned at a position drawn with a dashed and double-dotted line in FIG. 4. When held by the susceptor 74, the semiconductor wafer W is supported through point contact by the plurality of support pins 77 erected on the holding plate 75. The semiconductor wafer W is supported by the plurality of support pins 77 such that the center of the semiconductor wafer W coincides with the central axis of the placement surface 75*a* of the holding plate 75 (that is, a central part of the placement surface 75*a*). Specifically, the semiconductor wafer W supported by the plurality of support pins 77 is separated from the tapering surface 76*a* by a constant interval on an inner side of the tapering surface 76*a* on the inner periphery of the guide ring 76. When the semiconductor wafer W is held by the susceptor 74, the one main surface of the semiconductor wafer W, on which the thin film Lt0 of at least one of a monomolecular layer and a multi-molecular layer including the dopants IP0 is formed, faces upward. A predetermined interval is provided between a back surface (main surface opposite to the one main surface) of the semiconductor wafer W supported by the plurality of support pins 77 and the placement surface 75*a* of the holding plate 75. When elevated down to a position below the susceptor 74, the pair of transfer arms 11 are retracted to the retracted position, in other words, the inside of the recess 62 by the horizontal movement mechanism 13.

In step ST3, the semiconductor wafer W placed in the chamber 6 in step ST2 receives, through irradiation with light by the halogen lamps HL, preliminary heat treatment (preheat treatment) in a first temperature band At1 higher than a temperature (initial temperature) Tp0 before heating. In other words, the semiconductor wafer W is provided with the preheat treatment by the halogen heating unit 4. The first temperature band At1 is set to a temperature higher than a lowest temperature (lowest diffusion temperature) TH0 necessary for diffusion of impurities into the silicon substrate W0.

In the preheat treatment, for example, as illustrated in FIG. 10, the semiconductor wafer W is heated from the initial temperature Tp0 to the first temperature band At1 (specifically, a preheating temperature Tp1) set in advance in a duration (temperature increasing duration) from time t1 to time t2. Then, the heating temperature of the semiconductor wafer W is maintained in the first temperature band At1 in a duration (temperature keeping duration) from time t2 to time t3. The speed of temperature increase in the temperature increasing duration (time t1 to time t2) may be, for example, between 50° C./sec and 200° C./sec approximately. The first temperature band At1 may be, for example, between 800° C. and 1100° C. approximately. The temperature keeping duration may be, for example, between 1 second and 100 seconds approximately. When the semiconductor wafer W is provided with the preliminary heat treatment, the dopants IP0 are diffused from the thin film Lt0 into the silicon substrate W0 as illustrated in FIG. 12. Accordingly, the dopants IP0 are diffused to a surface layer part at a desired depth in the silicon substrate W0. Thus, the dopants IP0 included in the thin film Lt0 are introduced into the surface layer of the silicon substrate W0. In FIG. 10, a hatched part represents a thermal budget that contributes to the diffusion of the dopants IP0 into the silicon substrate W0. The thermal budget is a time integral of a temperature added to the temperature of the semiconductor wafer W as a substrate.

To start the preheat treatment, the forty halogen lamps HL of the halogen heating unit 4 are turned on all at once while the semiconductor wafer W is held in a horizontal posture from below by the susceptor 74 of the holding unit 7. Halogen light emitted by the halogen lamps HL transmits through the lower chamber window 64 and the susceptor 74 made of quartz and is incident on the back surface of the semiconductor wafer W. The semiconductor wafer W is heated through irradiation with light from the halogen lamps HL and accordingly, the temperature of the semiconductor wafer W increases. The transfer arms 11 of the transfer mechanism 10, which are retracted inside the recess 62, do not interfere heating by the halogen lamps HL.

During the preheat treatment by the halogen lamps HL, the temperature of the semiconductor wafer W is measured by the radiation thermometer 120. Specifically, the radiation thermometer 120 measures the increasing temperature of the wafer by receiving, through the opening 78, infrared light emitted from the back surface of the semiconductor wafer W held by the susceptor 74. The measured temperature of the semiconductor wafer W is notified to the control unit 3. The control unit 3 monitors whether the increasing temperature of the semiconductor wafer W being irradiated with light from the halogen lamps HL has reached at the desired first temperature band At1 (specifically, the preheating temperature Tp1) set in advance.

After the temperature of the semiconductor wafer W has reached at the preheating temperature Tp1, the control unit 3 temporarily maintains the semiconductor wafer W at the preheating temperature Tp1. Specifically, for example, when the temperature of the semiconductor wafer W measured by the radiation thermometer 120 has reached at the preheating temperature Tp1, the control unit 3 controls outputs of the halogen lamps HL to maintain the temperature of the semiconductor wafer W substantially at the preheating temperature Tp1.

The temperature of the entire semiconductor wafer W is uniformly increased to the preheating temperature Tp1 through the preheat treatment by the halogen lamps HL. However, at the stage of the preheat treatment by the halogen lamps HL, the temperature tends to be lower at the peripheral part of the semiconductor wafer W, from which heat is more likely to be released, than at the central part thereof. Since the halogen lamps HL in the halogen heating unit 4 are arranged more densely in the region facing to the peripheral part of the semiconductor wafer W than in the region facing to the central part thereof, uniform in-plane temperature distribution is achieved in the semiconductor wafer W at the stage of the preheat treatment.

In step ST4, the semiconductor wafer W provided with the preliminary heat treatment in step ST3 and placed in the chamber 6 receives, through irradiation with flash light by the flash lamps FL, treatment (flash heating treatment) in which the semiconductor wafer W is heated from the first temperature band At1 to a second temperature band At2. The second temperature band At2 is higher than the first temperature band At1. In other words, the semiconductor wafer W is provided with the flash heating treatment by the flash heating unit 5.

In the flash heating treatment, for example, as illustrated in FIG. 10, at time t3 at which the semiconductor wafer W is maintained in the first temperature band At1 through the preliminary heat treatment, the semiconductor wafer W is heated to the second temperature band At2 (specifically, a flash heating temperature Tp2) set in advance in an extremely short time. The second temperature band At2 may be, for example, higher than the first temperature band At1 by 100° C. or more. For example, in an aspect, when the preheating temperature Tp1 in the first temperature band At1 is 900° C., the second temperature band At2 is 1000° C. or higher. A duration in which the semiconductor wafer W is maintained in the second temperature band At2 may be, for example, an extremely short time of 0.1 millisecond to 100 milliseconds inclusive. When the semiconductor wafer W is provided with the flash heating treatment, the dopants IP0 diffused to the surface layer part of the silicon substrate W0 as illustrated in FIG. 13 are activated. Specifically, the dopants IP0 introduced to the surface layer of the silicon substrate W0 in step ST3 described above are activated.

When a predetermined time has elapsed since the temperature of the semiconductor wafer W reached at the preheating temperature Tp1, the flash lamps FL of the flash heating unit 5 irradiate the one main surface of the semiconductor wafer W with flash light. Part of the flash light emitted by the flash lamps FL travels directly into the chamber 6, and the other part is temporarily reflected by the reflector 52 and then travels into the chamber 6. The semiconductor wafer W is provided with the flash heating treatment through the irradiation with these parts of the flash light.

Since the flash heating treatment is performed through irradiation with flash light from the flash lamps FL, the temperature of the one main surface of the semiconductor wafer W can be increased in a short time. In other words, the flash light emitted by the flash lamps FL is extremely short and strong flash light in an irradiation time of 0.1 millisecond to 100 milliseconds approximately generated through conversion of electrostatic energy stored in the capacitor in advance into an extremely short light pulse. Then, the temperature of the one main surface of the semiconductor wafer W provided with the flash heating treatment through irradiation with the flash light from the flash lamps FL instantaneously increases to the flash heating temperature Tp2 of 1000° C. or higher to activate the dopants IP0 diffused in the surface layer part of the semiconductor wafer W, and then rapidly decreases. In this manner, the temperature of the one main surface of the semiconductor wafer W is increased in an extremely short time in the heat treatment device 1, which suppresses thermal diffusion of the dopants IP0 diffused to the surface layer part of the semiconductor wafer W whereas the dopants IP0 can be activated. A time taken for the activation of the dopants IP0 is extremely shorter than a time taken for the thermal diffusion of the dopants IP0. Thus, the activation can be completed in a short time of 0.1 millisecond to 100 milliseconds approximately, in which no diffusion occurs.

Through this flash light irradiation, the temperature of the one main surface of the semiconductor wafer W instantaneously increases to the predetermined temperature (flash heating temperature) Tp2 of 1000° C. or higher, but the temperature of the back surface thereof hardly increases from the preheating temperature Tp1 at the same time. In other words, a temperature difference is instantaneously generated between the one main surface and the back surface of the semiconductor wafer W. As a result, abrupt thermal expansion occurs only to the one main surface of the semiconductor wafer W, but almost no thermal expansion occurs to the back surface thereof, which causes the semiconductor wafer W to instantaneously become curved in a convex shape toward the one main surface. This instantaneous curvature causing the convex shape toward the one main surface causes the semiconductor wafer W to jump out of the susceptor 74 and move up.

Right after having jumped out of the susceptor 74 and moved up, the semiconductor wafer W falls toward the susceptor 74. However, the semiconductor wafer W, which has a thin plate shape, does not always vertically jump upward and then vertically fall downward, but is more likely to fall at a horizontally shifted position. As a result, the outer peripheral end of the semiconductor wafer W collides with the tapering surface 76*a* of the guide ring 76.

The surface of the guide ring 76 toward the semiconductor wafer W is the tapering surface 76*a* expanding upward from the holding plate 75. With this configuration, when the outer peripheral end of the semiconductor wafer W, which has a circular disk shape, collides with the guide ring 76, a contact area of the collision is larger than in collision with a guide pin through point contact, which leads to reduction of impact. As a result, any crack of the semiconductor wafer W and damage on the guide ring 76 can be prevented at irradiation with flash light. In particular, when the outer peripheral end of the semiconductor wafer W collides with the tapering surface 76*a*, kinetic energy is more dispersed than in collision with a horizontal surface, which leads to further reduction of impact, and accordingly, any crack of the semiconductor wafer W can be more reliably prevented.

When the outer peripheral end of the semiconductor wafer W collides with the tapering surface 76*a*, the outer peripheral end slips obliquely downward along the tapering surface 76*a*, and the position of the semiconductor wafer W in the horizontal direction is corrected toward a position (central part of the placement surface 75*a*) before the flash light irradiation. As a result, after falling, the semiconductor wafer W is supported by the plurality of support pins 77.

The halogen lamps HL are turned off after a predetermined time has elapsed since the semiconductor wafer W, which jumped through irradiation with flash light, fell and became supported by the plurality of support pins 77. Accordingly, the temperature of the semiconductor wafer W rapidly decreases from the preheating temperature Tp1. The decreasing temperature of the semiconductor wafer W is measured by the radiation thermometer 120, and a result of the measurement is notified to the control unit 3. The control unit 3 monitors whether the temperature of the semiconductor wafer W has decreased to a predetermined temperature based on the result of the measurement. Then, at time t4, after the temperature of the semiconductor wafer W has decreased to the predetermined temperature or lower, the pair of transfer arms 11 of the transfer mechanism 10 are horizontally moved from the retracted position to the transfer operation position and elevated up again so that the lift pins 12 protrude out of the upper surface of the susceptor 74 to receive the semiconductor wafer W provided with the heat treatment from the susceptor 74. Subsequently, the conveyance opening 66, which has been closed through the gate valve 185, is opened and the semiconductor wafer W placed on the lift pins 12 is conveyed out by the conveyance robot outside the device, which completes the heat treatment of the semiconductor wafer W at the heat treatment device 1.

As described above, in the heat treatment device 1 according to the one embodiment, the semiconductor wafer W having one main surface on which the thin film Lt0 of at least one of a mono-molecular layer and a multi-molecular layer including the dopants IP0 is formed is placed in the chamber 6, preliminarily heated to the first temperature band At1 through irradiation with light from the halogen lamps HL, and heated from the first temperature band At1 to the second temperature band At2 higher than the first temperature band At1 through irradiation with flash light from the flash lamps FL. Accordingly, the dopants IP0 can be introduced only to an extremely shallow region of the surface layer of the semiconductor wafer W and then activated. Since the heat treatment in the first temperature band At1 and the second temperature band At2 is continuously performed in the same chamber 6, a shorter time can be taken for the heat treatment than in a case in which heat treatment of diffusing impurities and heat treatment of activating the impurities are separately performed in different heat treatment devices. Since the single heat treatment device 1 needs to be provided instead of two heat treatment devices, a space needed for installation of the heat treatment device 1 can be easily obtained. Thus, device installation is facilitated and a heat treatment time can be reduced at a processing of introducing impurities only to the extremely shallow region of the surface layer of the semiconductor wafer W. In addition, for example, since the preliminary heat treatment and the flash heating treatment are continuously performed, heat treatment having a high thermal efficiency can be achieved.

The present invention is not limited to the one embodiment described above, but various kinds of changes and modifications are possible without departing the scope of the present invention.

For example, in the one embodiment described above, the semiconductor wafer W, which is maintained at the preheating temperature Tp1 in the first temperature band At1 in the preliminary heat treatment, is heated to the flash heating temperature Tp2 in the second temperature band At2 set in advance, but the present invention is not limited thereto. For example, the heating temperature of the semiconductor wafer W in the preliminary heat treatment may be slightly decreased right before the flash heating treatment.

Figure 14:
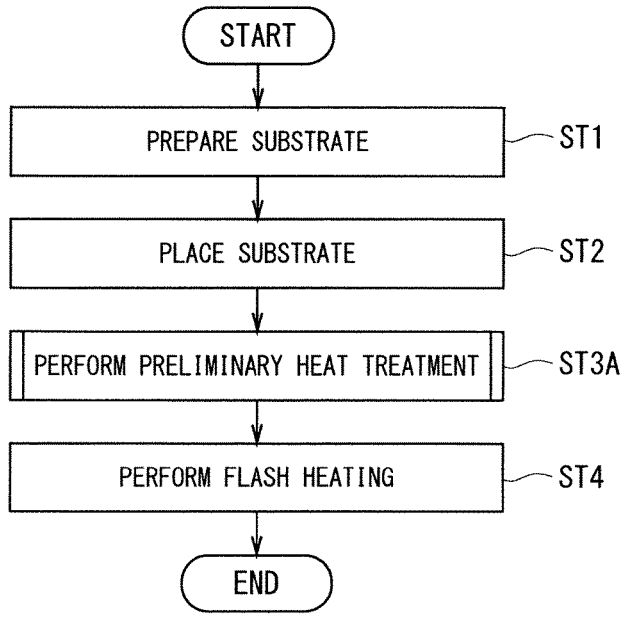
FIG. 14 is a diagram exemplarily illustrating a flowchart of thermal substrate treatment according to a modification.
Figure 15:
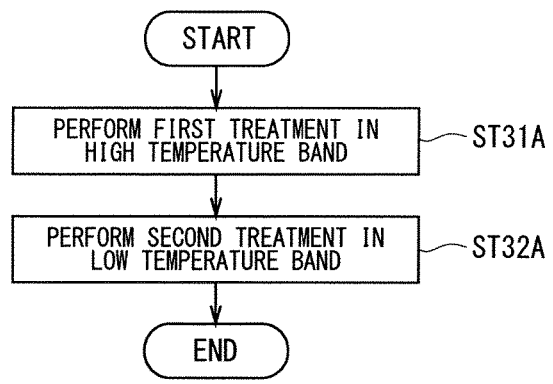
FIG. 15 is a diagram exemplarily illustrating a flowchart of the thermal substrate treatment according to the modification.
Figure 16:
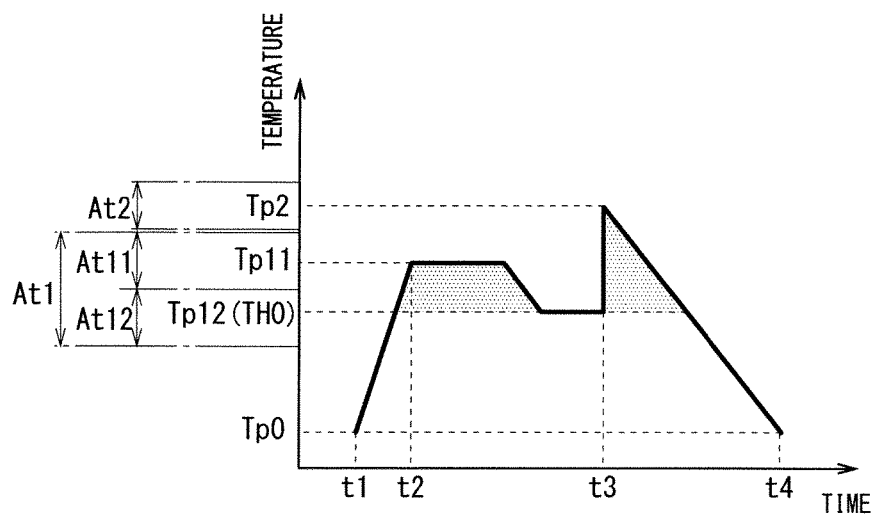
FIG. 16 is a diagram illustrating temporal change of a heat treatment temperature at a semiconductor wafer according to the modification.

The following describes a process of heat treatment of the semiconductor wafer W by the heat treatment device 1 according to one modification. FIGS. 14 and 15 are each a diagram exemplarily illustrating a flowchart of the process of the heat treatment of the semiconductor wafer W at the heat treatment device 1 according to the present modification. In the heat treatment of the semiconductor wafer W at the heat treatment device 1 according to the present modification, processing in steps ST1, ST2, ST3A, and ST4 illustrated in FIG. 14 is sequentially performed. FIG. 15 illustrates a process of heat treatment executed in step ST3A, and processing in steps ST31A and ST32A is sequentially performed in step ST3A. FIG. 16 is a diagram schematically illustrating exemplary temperature change at the surface layer part of the semiconductor wafer W at heat treatment according to the present modification. Similarly to FIG. 10, in FIG. 16, a hatched part represents a thermal budget that contributes to diffusion of the dopants IP0 to the silicon substrate W0.

The processing in steps ST1 and ST2 is same as that in steps ST1 and ST2 according to the one embodiment described above.

In step ST3A, similarly to step ST3 according to the one embodiment described above, the semiconductor wafer W placed in the chamber 6 in step ST2 receives, through irradiation with light from the halogen lamps HL, the preliminary heat treatment (preheat treatment) in the first temperature band At1 higher than the initial temperature Tp0 before heating. However, as illustrated in FIGS. 15 and 16, in step ST3A, the semiconductor wafer W is provided with first heat treatment (step ST31A) and with second heat treatment (step ST32A) following the first heat treatment.

The first heat treatment is heat treatment in a temperature band (high temperature band) At11 (specifically, at a first preheating temperature Tp11) that is higher temperature in the first temperature band At1 provided to the semiconductor wafer W through irradiation with light from the halogen lamps HL. The first heat treatment causes diffusion of the dopants IP0 from the thin film Lt0 into the silicon substrate W0. In other words, the dopants IP0 included in the thin film Lt0 are introduced from the thin film Lt0 to the surface layer of the silicon substrate W0 through the first heat treatment. The second heat treatment is heat treatment provided in a temperature band (low temperature band) At12 (specifically, at a second preheating temperature Tp12) that is lower than the high temperature band At11 in the first temperature band At1 after the first heat treatment. The second heat treatment can reduce a thermal budget that contributes diffusion of the dopants IP0 into the silicon substrate W0. Since the temperature of the semiconductor wafer W is relatively low before the flash heating treatment, excessive temperature increase of the semiconductor wafer W in the flash heating treatment is unlikely to occur, and thus the semiconductor wafer W can be immediately cooled after the flash heating treatment.

When the first preheating temperature Tp11 in the high temperature band At11 is set to, for example, 900° C. approximately, the second preheating temperature Tp12 in the low temperature band At12 may be set to, for example, 600° C. approximately. The second preheating temperature Tp12 may be set to, for example, the lowest diffusion temperature TH0 approximately. The second heat treatment may, but does not necessarily need to, perform introduction of the dopants from the thin film Lt0 to the surface layer of the silicon substrate W0 and diffusion of the dopants IP0 in the surface layer of the silicon substrate W0.

In the second heat treatment, for example, through irradiation with light from the halogen lamps HL, the semiconductor wafer W is maintained in the low temperature band At12 for a certain duration. In the second heat treatment, for example, the flash heating treatment may start after the temperature of the semiconductor wafer W has reached at the low temperature band At12 without irradiating the semiconductor wafer W with light from the halogen lamps HL.

In step ST4 following step ST3A, similarly to the one embodiment described above, the semiconductor wafer W provided with the preliminary heat treatment in step ST3A and held by the holding unit 7 inside the chamber 6 is provided with the flash heating treatment that heats the semiconductor wafer W from the first temperature band At1 to the second temperature band At2 through irradiation with flash light from the flash lamps FL. Accordingly, the dopants IP0 introduced into the surface layer of the silicon substrate W0 in step ST3A described above are activated. As illustrated in FIG. 16, in preliminary heat treatment by the halogen heating unit 4 in step ST4 according to the present modification, when the flash lamps FL of the flash heating unit 5 irradiate, with flash light, the semiconductor wafer W being provided with the second heat treatment in the low temperature band At12, the semiconductor wafer W is heated from the low temperature band At12 to the second temperature band At2.

In this manner, the semiconductor wafer W is heated from the low temperature band At12 to the second temperature band At2 through the first heat treatment and the second heat treatment continuously performed in the preliminary heat treatment, and thus the second temperature band At2 is unlikely to be unnecessarily high. As a result, abnormal diffusion of the dopants IP0 in the semiconductor wafer W is unlikely to occur at heating through irradiation with flash light. Accordingly, the dopants IP0 can be appropriately introduced only into an extremely shallow region of the surface layer of the semiconductor wafer W.

As described above, in the heat treatment device 1 and heat treatment method according to the present modification, the semiconductor wafer W is provided with first treatment that heats, through irradiation with light from the halogen lamps HL, the semiconductor wafer W to the high temperature band At11 that is higher temperature in the first temperature band At1, and then with second treatment that cools the semiconductor wafer W from the high temperature band At11 to the low temperature band At12 that is lower temperature in the first temperature band At1. Then, the semiconductor wafer W cooled to the low temperature band At12 is heated from the low temperature band At12 to the second temperature band At2 through irradiation with flash light from the flash lamps FL. Accordingly, the dopants IP0 can be introduced only into extremely shallow region of the surface layer of the semiconductor wafer W and activated, and abnormal diffusion of the dopants IP0 in the semiconductor wafer W is unlikely to occur at heating through irradiation with flash light. In addition, since the heat treatment is continuously performed in the same chamber 6 in the first temperature band At1 and the second temperature band At2, device installation is facilitated and a heat treatment time can be reduced.

In the one embodiment described above, the number of halogen lamps HL in the halogen heating unit 4 is forty, and the number of flash lamps FL in the flash heating unit 5 is thirty, but the present invention is not limited thereto. The number of halogen lamps HL and the number of flash lamps FL may be set to optional numbers.

A substrate to be treated by the heat treatment device 1 according to the present invention is not limited to a silicon substrate with one main surface on which the thin film Lt0 of at least one of a mono-molecular layer and a multi-molecular layer including the dopants IP0 is formed, but may be any other substrate with one main surface on which the thin film Lt0 of at least one of a mono-molecular layer and a multi-molecular layer including the dopants IP0 is formed. In this case, the dopants IP0 can be appropriately introduced only into an extremely shallow region of the surface layer of the substrate.

It is possible to combine, as appropriate without causing inconsistency, all or some of components in each of the one embodiment and the modifications described above.

REFERENCE SIGNS LIST

1: heat treatment device
3: control unit
4: halogen heating unit
5: flash heating unit
6: chamber
7: holding unit
At1: first temperature band
At11: high temperature band
At12: low temperature band
At2: second temperature band
FL: flash lamp (xenon flash lamp)
HL: halogen lamp
IP0: impurity (dopant)
Lt0: thin film
TH0: lowest diffusion temperature
Tp0: initial temperature
Tp1: preheating temperature
Tp11: first preheating temperature
Tp12: second preheating temperature
Tp2: flash heating temperature
W: semiconductor wafer
W0: silicon substrate

The invention claimed is:

1. A heat treatment method comprising:
   step (a) of preparing a substrate with one main surface on which a thin film of at least one of a mono-molecular layer and a multi-molecular layer including dopants is formed;
   step (b) of placing said substrate prepared in said step (a) in a chamber;
   step (c) of introducing said dopants included in said thin film from the thin film to a surface layer of said substrate by providing said substrate placed in said chamber in said step (b), through irradiation with light from a first lamp that provides continuously emitting light, with preliminary heat treatment for maintaining said substrate at a first temperature band higher than a temperature before heating; and
   step (d) of activating said dopants introduced into the surface layer of said substrate in said step (c) by heating said substrate provided with the preliminary heat treatment in said step (c) and placed in said chamber from said first temperature band to a second temperature band higher than the first temperature band through irradiation with flash light from a second lamp.

2. The heat treatment method according to claim 1, wherein
   in said step (c), said substrate placed in said chamber is provided with first heat treatment in a high temperature band that is higher temperature in said first temperature band through irradiation with light from said first lamp, and then with second heat treatment in a low temperature band that is lower than said high temperature band in said first temperature band, and
   in said step (d), said substrate provided with said second heat treatment in said step (c) and placed in said chamber is heated from said low temperature band to said second temperature band through irradiation with said flash light from said second lamp.

* * * * *